United States Patent
Weld

[19]

[11] Patent Number: 5,773,322
[45] Date of Patent: Jun. 30, 1998

[54] MOLDED ENCAPSULATED ELECTRONIC COMPONENT

[75] Inventor: John David Weld, Succasunna, N.J.

[73] Assignee: Lucent Technologies Inc., Murray Hill, N.J.

[21] Appl. No.: 884,095

[22] Filed: Jun. 27, 1997

Related U.S. Application Data

[62] Division of Ser. No. 784,722, Jan. 16, 1997, abandoned, which is a division of Ser. No. 431,590, May 1, 1995, abandoned.

[51] Int. Cl.[6] .......................... H01L 21/44; H01L 21/48; H01L 21/50
[52] U.S. Cl. .......................... 438/117; 438/123; 438/124; 438/127; 264/272.17
[58] Field of Search ............... 257/666, 676, 257/678, 684, 690, 692, 712, 722, 734, 787, 796; 438/117, 123, 124, 127; 264/272.17

[56] References Cited

U.S. PATENT DOCUMENTS

| 4,490,903 | 1/1985 | Agatahama | 29/622 |
|---|---|---|---|
| 4,838,347 | 6/1989 | Dentini et al. | 165/185 |
| 5,033,972 | 7/1991 | Komatsu et al. | 439/153 |
| 5,140,405 | 8/1992 | King et al. | 357/67 |
| 5,155,302 | 10/1992 | Nguyen | 174/88 R |
| 5,270,262 | 12/1993 | Switky et al. | 438/123 |
| 5,300,808 | 4/1994 | Suppelsa et al. | 287/680 |
| 5,302,849 | 4/1994 | Cavasin | 257/666 |
| 5,663,106 | 9/1997 | Karavakis et al. | 438/127 |

OTHER PUBLICATIONS

Fulton et al—Applications and Reliability of the AT&T Elastomeric Conductive Polymer Interconnection System—Proceedings of the Technical Conference (1990) International Electronics Packaging Conference, Marlborough, Mass (Sep. 10–12, 1990) pp. 930–942.

Elastomeric Technologies Inc—Technical Data Sheet re: Silfil/Carfil Conductive Silicone Sheet (1 page).

Elastomeric Technologies Inc—Elastomeric Selection Guide (1 page).

*Primary Examiner*—John Niebling
*Assistant Examiner*—David A. Zarneke

[57] ABSTRACT

A molded encapsulated electronic component containing a silicon device, chip, or integrated circuit characterized by ease of fabrication and minimum possibility of breakage or dislocation, included a lead frame bearing a compressed, thin elastomeric, anisotropic, electrically conductive compliant interconnect on which the silicon integrated circuit is positioned—all mounted within an all-enveloping plastic.

13 Claims, 3 Drawing Sheets

MOLDED ENCAPSULATED ELECTRONIC COMPONENT

This application is a division of application Ser. No. 08/784,722 filed Jan. 16, 1997 which is a division of application Ser. No. 08/431,590 filed May 1, 1995, both now abandoned.

FIELD OF THE INVENTION

This invention relates to a molded encapsulated electronic component and more particularly to a method of forming a molded encapsulated electronic component.

BACKGROUND OF THE INVENTION

As is well known to those skilled in the art, microelectronic packages are becoming smaller and thinner and problems in fabrication have arisen because of the thinner more fragile integrated circuit devices, thinner flow channels for encapsulating plastic, increased flow-induced stresses, and lower wire bond loop heights. It has become fairly common to position the device in a package so that one face (a non-active face) of the device is mounted flush to the external surface of the package. This allows for increased flow channels and wire bond headroom on the opposite (active) face of the device. It is frequently found that it is increasingly difficult to accurately position the device (and maintain it in position) so that it will be in contact with the mold cavity wall under uniform pressure—to prevent plastic from flowing between the device and the mold wall and to prevent the device from cracking due to pressure of the mold wall. These prior art problems make it difficult to obtain a finished package wherein the device is flush mounted with the surface of the package after the encapsulating plastic polymerizes and fixes the device in place. It is also frequently found in prior art that it is difficult to accurately position the device to provide sufficient pressure against the mold wall to prevent plastic from flowing between the device and the mold.

OBJECTS OF THE INVENTION

It is an object of the present invention to provide an apparatus as well as a method of forming a molded, encapsulated microelectronic integrated circuit package particularly characterized by self alignment of the encapsulated device which permits use of coarse assembly tolerances when the mold closes and thus minimizes cracking of the device. It is a further object of this invention to provide an electrical conductive path from the encapsulated integrated circuit to other components within the package. Other objects will be apparent to those skilled in the art.

STATEMENT OF THE INVENTION

In accordance with certain of its aspects, this invention is directed to a method of forming a molded encapsulated electronic component including a lead frame onto which is mounted an integrated circuit (IC) which comprises:

maintaining said lead frame in the lower half of an enveloping mold cavity having upper and lower mold halves;

placing on said lead frame a thin, elastomeric, anisotropic, electrically conductive, compliant interconnect having a first face and a second face, the first face of said interconnect being in contact with said lead frame;

placing the first face of an integrated circuit, having a first face and a second face, on the second face of said interconnect;

positioning an enclosing upper mold half, having a cavity wall adapted to receive said second face of said integrated circuit, on said lower mold half, said upper mold half pressing against said integrated circuit and said elastomeric, anisotropic, electrically conductive, compliant interconnect thereby compressing the latter and maintaining said integrated circuit in predetermined position within said enclosed mold, the second face of said integrated circuit being coplanar with the cavity wall of said upper mold half;

admitting to the interior of said mold cavity a shear-thinning, thermosetting plastic;

curing said shear-thinning, thermosetting plastic thereby forming a molded electronic component including said lead frame bearing said thin, compressed, elastomeric, anisotropic, electrically conductive, compliant interconnect on which is mounted said integrated circuit;

and recovering said molded electronic component including said lead frame bearing said thin, compressed, elastomeric, anisotropic, compliant, electrically conductive interconnect on which is mounted said integrated circuit.

In accordance with certain of its other aspects, this invention is directed to a molded encapsulated electronic component comprising:

a lead frame including at least one plurality of leads extending from a central portion of said lead frame and terminating adjacent to an edge of said lead frame;

a thin, elastomeric, anisotropic, electrically conductive, compliant, interconnect containing a plurality of separate electrically conductive paths extending across the thickness from a first face to a second face thereof, the first face of said interconnect being in electrical contact with a lead adjacent to the central portion of said lead frame, said compliant interconnect elastomer being compressed to a thickness less than its uncompressed thickness;

an integrated circuit having a first and a second face, mounted on said elastomer, the first face of said silicon integrated circuit being in electrical contact with the second face of said elastomer, said integrated circuit being enclosed within said encapsulating electronic component except for the second face of said integrated circuit; and a molded plastic body, having a first and a second face, enclosing said electronic component except for said second face of said integrated circuit which is exposed and is coplanar with the second face of said plastic body.

ADVANTAGES OF THE INVENTION

It is a feature of the process and apparatus of the instant invention that it is characterized by advantages including the following:

(a) The use of a thin, elastomeric, electrically conductive, compliant interconnect minimizes the possibility of breakage of the fragile integrated circuit device under the clamping load of the molding process which is typically above 150 tons per square inch.

(b) The need to properly position and to align the device is less crucial because the compressible, elastomeric, anisotropic, electrically conductive interconnect allows for some errors in positioning and/or alignment.

(c) The presence of the elastomeric interconnect is found to permit a self-alignment of the integrated circuit in the mold.

(d) It is possible to use coarser assembly tolerances when the mold is closed without increasing the probability of cracking or breakage.

Figure 1:
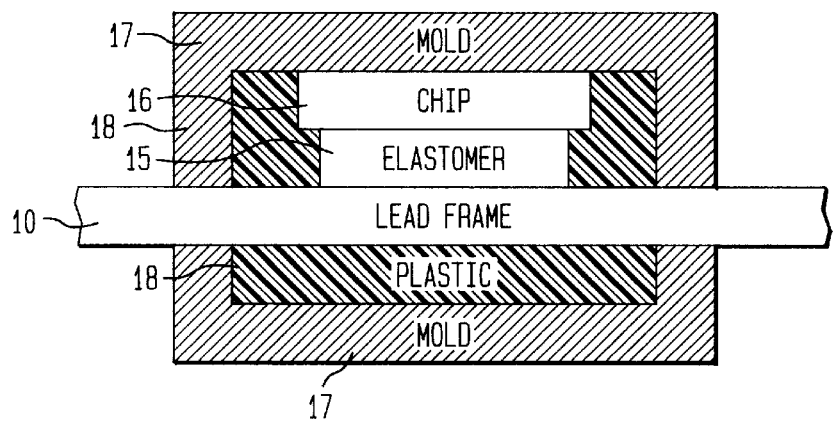
FIG. 1 schematically shows a cross-section of a molded encapsulated electronic component prepared in accordance with this invention—showing particularly the relationship of the lead frame, the elastomer, the integrated circuit, and the encapsulating plastic.

The drawings are not to scale.

DESCRIPTION OF THE INVENTION

The molded encapsulated electronic component of this invention includes a lead frame substrate which is typically formed of a conductor, usually copper bearing a layer of electrodeposited silver or nickel. The lead frame is commonly of width of 2–4 cm., say about 3 cm. and of total thickness of 0.1–0.5 mm, say 0.2 mm.; and it may have a rectangular shape. The lead frame includes at least one plurality of leads extending from a central portion of the lead frame and terminating adjacent to an edge of said lead frame. More preferably the lead frame typically includes a first plurality of leads passing from a central portion of the frame toward a first edge of the frame and a second plurality of leads passing from a central portion of the frame toward a second edge of the frame. The leads preferably terminate adjacent to a first and a second transverse edge of the frame respectively. During fabrication of the component, each lead in the first and second plurality of leads is connected by a dam bar to an adjoining lead to provide structural stability and to subsequently prevent the encapsulating plastic from flowing past the leads.

The thin, elastomeric, anisotropic, electrically conductive, compliant interconnect polymer which is employed in practice of this invention may be of thickness of 0.1–1.0 mm (in the z direction across the thinnest dimension) and typically in the form of a square piece of sheet of dimension of 2–8, say 5 mm.

The polymer may be any resilient polymer which is capable of being compressed under the loads applied during fabrication of the assembly. Typical polymers which may be employed include silicone elastomers, flexible epoxies, polyurethanes, etc. One preferred elastomer is a heat-curable silicone elastomer typified by the Dow Corning Silastic E brand of silicone elastomer—typically having an elongation factor before rupture of at least 350%, a Shore A durometer of less than 50, and a tear strength of at least about 85 psi—after curing.

The resilient, compressible, silicone elastomer contains electrically conductive particles in amount of 25–75, say about 50 volume % of the elastomer. The particles may typically be 3 mil mean diameter nickel spheres or flakes. Other suitable electrically conductive particulate materials may include cobalt, iron, or electrically conducting ceramics, oxides, or intermetallic compositions. These electrically conductive particles or flakes may be mixed with the uncured polymer and the mixture subjected to a magnetic field as the polymer is cured, The magnetic field is positioned to direct the particles or flakes into columnar configurations across the shortest (or z) direction of the elastomeric sheet. The cured elastomeric body includes the particles in anisotropic columnar configuration which establishes electrically conductive paths across the compressible elastomer. Each columnar configuration is independent of other columnar configurations. Details of this composition may be noted from U.S. Pat. No. 4,838,347 which issued 13 Jun. 1989 to American Telephone and Telegraph Company AT&T Bell Laboratories as assignee of Mark S. Dentini et al.

Alterative elastomers, which may under certain conditions be preferred because they may be presently cheaper, include (a) an elastomer formed of alternating layers of a conducting layer and a non-conducting layer of silicone, (b) alternating layers of non-conductive silicone and conductive metal such as sillver, or (c) alternating layers of of metal-on-silicone elastomer—as marketed by Elastomeric Technologies Inc of Hatboro, Pa. under various trademarks including the STAX or MOE trademarks. These anisotropic elastomers are each characterized by the presence of electrically conductive paths in the z direction across the shortest dimension.

In practice of the process of this invention, the central portion of the lead frame (on which the integrated circuit is to be mounted) is placed within the lower half of an enveloping mold cavity which has upper and lower mold halves. The compressible electrically conducting elastomer sheet of interconnect (which has a first and a second face) is placed on the lead frame in manner to ensure that an electrical contact is established between the lead frame and the conducting portions of the elastomer. The first face of the sheet or interconnect is in electrical contact with the lead frame.

There is then placed on the second face of the elastomer the integrated circuit. Typical integrated circuit devices or chips may be formed of semi-conductor materials such as gallium arsenide, germanium, lead sulfide, or preferably silicon. The integrated circuit may be for example a Schottky diode with both surfaces active. The mold is closed by positioning the upper half of the mold in manner to mate with the lower half and to enclose the lead frame, the elastomer, and the integrated circuit. The mold is structured so that the integrated circuit fits in predetermined position within the enclosing mold and is aligned with theoutside face of the cavity wall of the upper half of the mold. The mold is structured so that the integrated circuit contacts the inner cavity wall portion of the upper half of the mold whereby the upper part of the silicon device is visible in the finished assembly.

When the upper half of the mold is fitted onto the lower half of the mold, the former presses against the silicon device and the compressible elastomer. The pressure of the mold cover is typically 100–200, say 150 tons per square inch which is sufficient to compress the elastomer by 5–20%, say about 15% of its uncompressed thickness (in the z direction).

When the mold is closed, the upper or second face of the integrated circuit is pressed against the lower face of the enclosing mold; and it is in position to be exposed and to be coplanar with the plane of the upper face of the encapsulating plastic. The lower or first face of the integrated circuit is pressed against the upper or second face of the compressed elastomer; and the compressed elastomer is in electrical contact with the lead frame.

There is then injected into the mold cavity through an inlet, the encapsulating shear-thinning thermosetting plastic which, as injected, has a low viscosity. Shortly after the thermosetting plastic is injected (typically 15–35 seconds, say 25 seconds), the mold is subjected to curing temperature of say 165 C.–185 C., say 170 C. at pressure of 500–1500 psig, say 1000 psig. The preferred plastic used as the encapsulating plastic is an epoxy.

At the conclusion of the curing of the encapsulating plastic, the mold is opened. The package assembly is then subjected to desired succeeding steps including cutting of the dam bars from the lead frame (to ensure separation of the leads) and forming the leads into the desired configuration.

The final product, because the mold wall is in contact with the surface of the integrated circuit, is characterized by the fact that the surface of the latter is in the same plane as the surface of the package and is exposed on the face of the package. The molded plastic body provides supporting structure for the integrated circuit which is accurately positioned and self-aligned.

DESCRIPTION OF SPECIFIC EMBODIMENTS

EXAMPLE I

Figure 2:
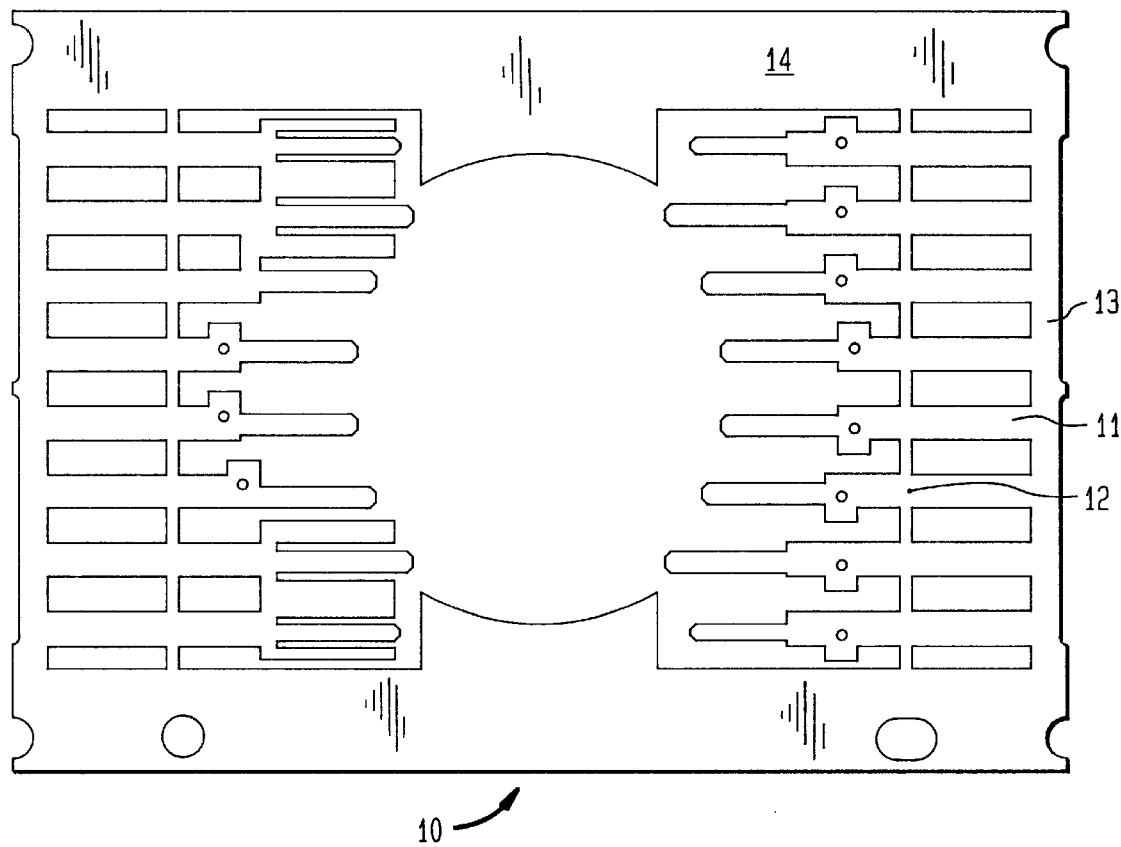
FIG. 2 shows a plan view of a lead frame.

In the preferred embodiment as set forth in FIGS. 1 and 2, a lead frame 10 is provided—formed of a copper strip of thickness of 0.2 mm, a width of 3 mm and a length of 3 mm. The copper lead frame 10 bears a first electrodeposit of silver and a second electrodeposit of nickel—of thickness of 5 mils.

Lead frame 10 includes a plurality of leads 11 and dam bars 12 and 13 each of which extends transversely across the lead frame 10 to provide structural support for the leads 11. A transverse portion of the lead frame is designated as rail 14.

The elastomeric, anisotropic, electrically conductive interconnect to be employed is the Dow Corning Silastic E Brand of silicone (characterized by the following properties: an elongation factor before rupture of at least 350%, a Shore A Durometer of less than 50, and a tear strength of at least about 85 psi—after curing.

The polymer contains 50 vol % of 3 mil nickel particles bearing an electroplated layer of copper. The mixture of particles and elastomer is cured by heating to 1100 C. for 15 minutes. During heating/curing, the mixture is subjected to a magnetic field (transverse to the z direction) of about 300 oersteds. During curing in the presence of the magnetic field, the copper-plated nickel particles become aligned to form a plurality of separate columnar patterns which are electrically conductive.

The elastomeric conductive polymer interconnect (ECPI) to be employed is a piece of 5 mm×5 mm dimension of thickness of 0.5 mm. It is formed as shown in FIG. 2 of U.S. Pat. No. 4,838,347 of Dentini et al. See also The Proceeding of the Technical Conference 1990 International Electronics Packaging Conference—Marlborough, Mass., Sep. 10–12, 1990: *Applications and Reliability of the AT&T Elastomeric Conduction Polymer Interconnect (ECPI) System.* The ECPI polymer 15 is positioned on the lead frame 10.

The silicon semi-conductor, device or chip or integrated circuit 16 is placed on top of the elastomer 15. The entire assembly of integrated circuit 16, elastomer 15, and lead frame 10 is then placed within mold 17. The integrated circuit 16 is forced against the upper half of the mold 17—by the elastomeric interconnect so that when the process is complete, the face of the integrated circuit will be visible and not covered by the molding plastic 18.

The upper half of the mold 17 is pressed against the face of the integrated circuit with a pressure of 150 tons per square inch and this compresses the elastomer by about 15% of is uncompressed thickness. During this process, the integrated circuit is self-aligned in its position in the lead frame. After the mold is closed, there is then injected an epoxy as a shear thinning plastic 18.

The mold, filled with shear thinning epoxy 18, is maintained at about 170 C. and 1000 psig for about 180 seconds. During the injection period, the epoxy is free-flowing as admitted. As it is maintained in the mold at curing conditions, it hardens into an all-enveloping plastic matrix. The assembly is characterized by the fact that the integrated circuit is maintained in fixed position, properly aligned, and is unbroken.

EXAMPLE II

Results comparable to those of Example I may be obtained if the elastomer is the Elastomeric STAX brand of alternating layers of conductive and non-conductive silicone—as marketed by Elastomeric Technologies Inc.

EXAMPLE III

Results comparable to those of Example I may be obtained if the elastomer is the Elastomeric MOE brand of elastomer which contains non-conductive silicone bearing a conductive metal layer of gold.

EXAMPLE IV

Results comparable to those of Example I may be obtained if the elastomer is the Elastomeric MOE brand of elastomer which contains non-conductive silicone bearing a conductive metal layer of nickel

EXAMPLE V

Figure 3:
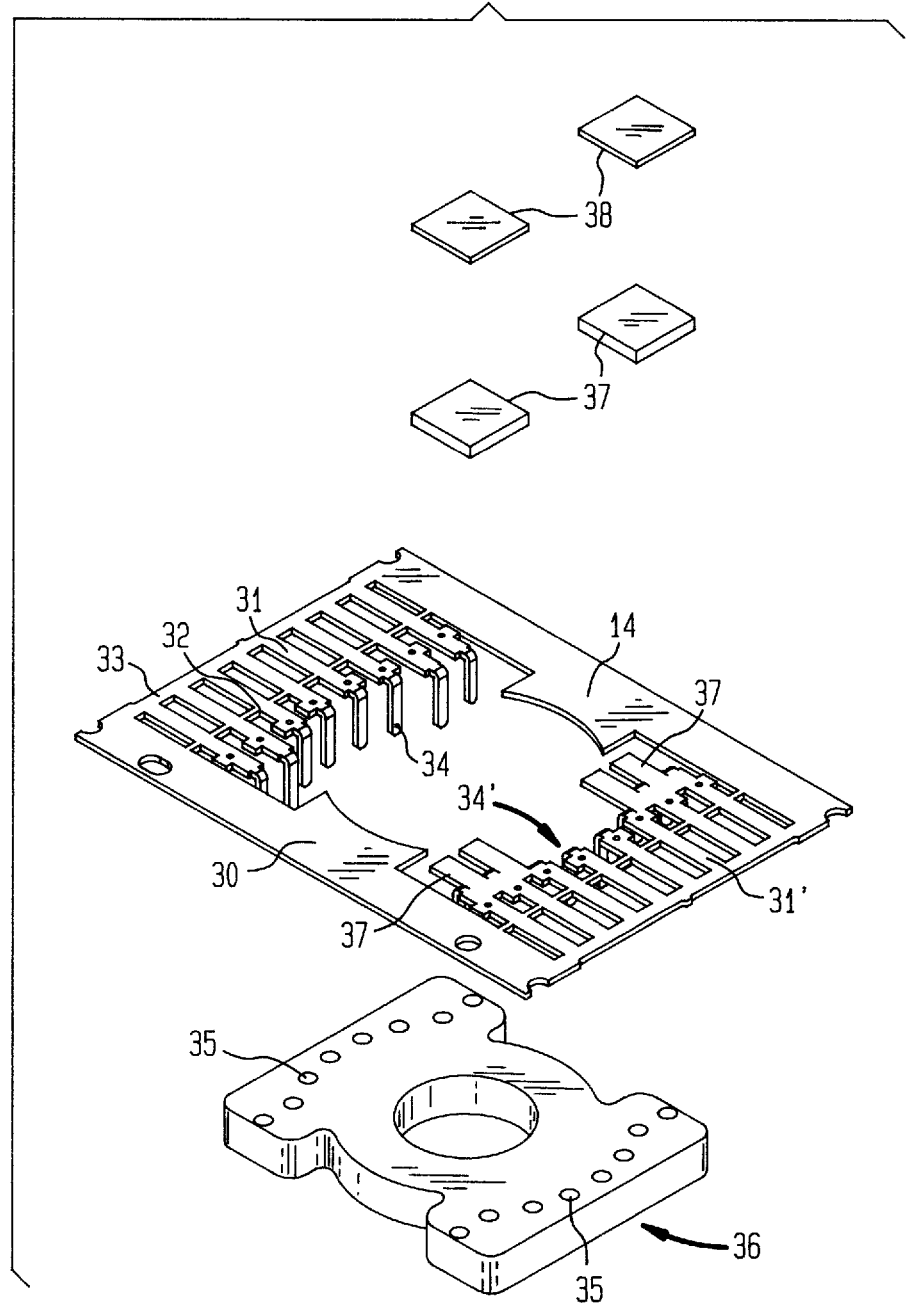
FIG. 3 shows a view of a lead frame and component parts prior to assembly.
Figure 4:
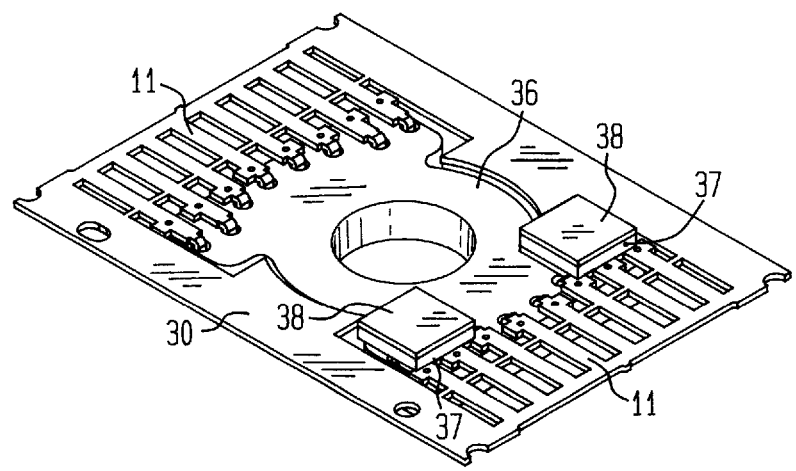
FIG. 4 shows a view of the assembled component parts prior to enclosing within the mold.
Figure 5:
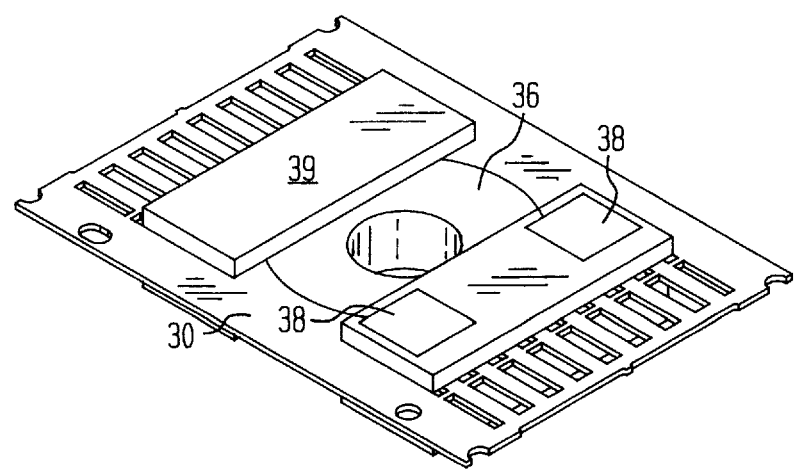
FIG. 5 shows a view of the assembled component including the integrated circuit and compressed elastomer after the assembly is released from the mold.

This example (q.v. FIGS. 3, 4, and 5) shows in greater detail the assembly of a molded encapsulated electronic component. FIG. 3 represents an exploded schematic view of the several parts of the assembly. As in FIGS. 1 and 2, it includes a lead frame 30, first a plurality of leads 31 and a second plurality of leads 31' each of which extends from a central portion of the lead frame along a major axis and which terminate respectively adjacent to first and second transverse edges. In this embodiment, the inner ends of the leads 31 and 31' designated 34 and 34' are bent perpendicularly in a direction away from the plane of the lead frame 30. These inner ends are adapted and positioned to fit into the terminal slots 35 of component 36 which in this instance is a transformer. The transformer 36 is pressed against the lead frame 30 in manner to permit the inner ends of the lead frame to mate with the terminal slots 35 of the transformer.

The lead frame also includes a first and a second group of leads 37 which are not bent, but which remain in the plane of the lead frame, and which occupy the area on which the elastomeric, anisotropic, electrically conductive compliant interconnects 37 are placed. There is then placed on top of the elastomeric interconnects 37 the silicon integrated circuits which in this case are Schottky diodes with both faces active.

FIG. 4 schematically shows the assembly prior to the closing of the enclosing mold. The mold is then closed around the so-assembled configuration in manner so that the upper surfaces of the silicon integrated circuits are pressed against the face of the upper mold half—this prevents the passage of encapsulating plastic from covering the upper surfaces of the silicon integrated circuits. The closed mold is subjected to a pressure of 150 tons per square inch which compresses the elastomeric compliant interconnect (by about 15% of its uncompressed thickness) as the silicon integrated circuit is pressed thereagainst. This ensures that the latter is properly seated in predetermined position within the enclosed mold, the upper or second face of the silicon integrated circuit being coplanar with the cavity wall of the upper mold half.

There is then admitted to the mold cavity the shear thinning epoxy. Curing is effected by maintaining the entire assembly at about 170 C. and 1000 psig for about 180 seconds. During the injection period, the epoxy is free-flowing; and as it is maintained within the mold during the curing operation, it hardens into an all-enveloping plastic matrix. The assembly is characterized, as in the embodiment of Example I, by the fact that the silicon integrated circuits are maintained in fixed position, properly aligned, and is unbroken.

FIG. 5 shows the finished assembled component including the hardened all-enveloping plastic matrix 39. The outer portions of the silicon devices 38 are not covered by the plastic matrix. The silicon integrated circuits are positioned in predetermined location and aligned because of the fact that they each rest on a thin, elastomeric, anisotropic, electrically conductive compliant interconnect which has been compressed during assembly.

Although this invention has been described with respect to specific embodiments, it will be apparent to those skilled in the art that various changes and modification may be made thereto which fall within the scope of the invention.

I claim:

1. The method of forming a molded encapsulated electronic component including a lead frame onto which is mounted an integrated circuit which comprises maintaining said lead frame in the lower half of an enveloping mold cavity having upper and lower mold halves;

placing on said lead frame a thin, elastomeric, anisotropic, electrically conductive, compliant interconnect having a first and a second face, the first face of said interconnect being in contact with said lead frame;

placing the first face of an integrated circuit, having a first face and a second face on the second face of said interconnect;

positioning an enclosing upper mold half having a cavity wall adapted to receive said second face of said integrated circuit, on said lower mold half, said upper mold half pressing against said integrated circuit and said elastomeric, anisotropic, electrically conductive, compliant interconnect thereby compressing the latter and maintaining said integrated circuit in a predetermined position within said enclosed mold, said second face of said integrated circuit being coplanar with the cavity wall of said upper mold half;

admitting to the interior of said mold cavity a shear-thinning, thermosetting plastic;

curing said shear thinning, thermosetting plastic thereby forming a molded electronic component including said lead frame bearing said thin compressed, elastomeric anisotropic, compliant, electronically conductive interconnect on which is mounted said integrated circuit wherein said elastomeric, anisotropic, electrically conductive, compliant interconnect is maintained in a compressed state; and, recovering said molded electronic component including said lead frame bearing said thin, compressed, elastomeric anisotropic, compliant, electrically conductive, interconnect on which is mounted said integrated circuit.

2. The method claimed in claim 1 wherein said thin, elastomeric, anisotropic, electrically conductive, compliant interconnect is a silicone elastomer.

3. The method claimed in claim 1 wherein said thin, elastomeric, anisotropic, electrically conductive, compliant interconnect is a silicone elastomer containing a plurality of conductive particles arrayed in columnar configurations electrically connecting the first and second faces of said interconnect.

4. The method claimed in claim 1 wherein said thin, elastomeric, anisotropic, electrically conductive, compliant interconnect is formed of alternating layers of conducting silicone elastomer and non-conducting silicone elastomer, said conducting layers of silicon elastomer connecting said first and second faces of said interconnect.

5. The method claimed in claim 1 wherein said thin, elastomeric, anisotropic, electrically conductive, compliant interconnect is formed of alternating layers of non-conductive silicone and conducting metal, said conducting layers of metal connecting said first and second faces of said interconnect.

6. The method claimed in claim 1 wherein said integrated circuit is a silicon chip.

7. A method of forming a molded encapsulated electronic component including a lead frame onto which is mounted an integrated circuit which comprises:

maintaining said lead frame in an enveloping cavity of a mold lower half;

placing on said lead frame a thin anisotropically conductive elastomer having a first face and a second face, wherein said first face is in contact with said lead frame;

placing an integrated circuit having a first face and a second face, on said second face of said thin anisotropically conductive elastomer;

positioning a mold upper half having a cavity adapted to receive said second face of said integrated circuit, on said mold lower half, said mold upper half pressing against said integrated circuit and said thin anisotropically conductive elastomer thereby placing said thin anisotropically conductive elastomer in a compressed state and maintaining said integrated circuit in a predetermined position within said cavity of said mold upper half, wherein said enveloping cavity of said mold upper half and said cavity of said mold lower half define an interior cavity;

admitting to said interior cavity an encapsulating material;

curing said encapsulating material thereby forming a molded electronic component wherein said thin anisotropically conductive elastomer is maintained in said compressed state.

8. The method as recited in claim 7 further comprising the step of releasing said mold upper half and said mold lower half.

9. The method as recited in claim 8 further comprising the step of recovering said molded electronic component.

10. The method as recited in claim 7 wherein said encapsulating material is a thermosetting plastic.

11. The method as recited in claim 7 wherein said compressed state of said thin anisotropically conductive elastomer represents at least a 5% compression.

12. The method as recited in claim 7 wherein said compressed state of said thin anisotropically conductive elastomer represents about a 15% compression.

13. The method as recited in claim 7 wherein said thin anisotropically conductive elastomer in a compressed state by a pressure of about 150 tons per square inch applied to said mold upper half and said mold lower half.

* * * * *